(12) United States Patent
Trentzsch et al.

(10) Patent No.: US 8,119,461 B2
(45) Date of Patent: Feb. 21, 2012

(54) REDUCING THE CREATION OF CHARGE TRAPS AT GATE DIELECTRICS IN MOS TRANSISTORS BY PERFORMING A HYDROGEN TREATMENT

(75) Inventors: Martin Trentzsch, Dresden (DE); Thorsten Kammler, Ottendorf-Okrilla (DE); Rolf Stephan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/916,681

(22) Filed: Nov. 1, 2010

(65) Prior Publication Data

US 2011/0045665 A1 Feb. 24, 2011

Related U.S. Application Data

(62) Division of application No. 12/125,490, filed on May 22, 2008, now abandoned.

(30) Foreign Application Priority Data

Dec. 31, 2007 (DE) .......................... 10 2007 063 270

(51) Int. Cl.
  *H01L 21/335* (2006.01)
  *H01L 21/8232* (2006.01)
(52) U.S. Cl. ........ 438/143; 438/275; 438/287; 438/475; 438/585; 257/E21.212; 257/E21.318; 257/E21.453
(58) Field of Classification Search .................. None
  See application file for complete search history.

(56) References Cited

U.S. PATENT DOCUMENTS

| 4,277,320 | A | 7/1981 | Beguwala et al. | 204/164 |
|---|---|---|---|---|
| 5,445,975 | A | 8/1995 | Gardner et al. | 438/449 |
| 6,054,355 | A | 4/2000 | Inumiya et al. | 438/296 |
| 6,140,688 | A * | 10/2000 | Gardner et al. | 257/412 |
| 6,238,990 | B1 * | 5/2001 | Aga et al. | 438/308 |
| 6,255,698 | B1 * | 7/2001 | Gardner et al. | 257/369 |
| 6,271,573 | B1 | 8/2001 | Suguro | 257/407 |
| 6,368,923 | B1 * | 4/2002 | Huang | 438/275 |
| 6,586,293 | B1 * | 7/2003 | Hasegawa | 438/216 |
| 7,157,378 | B2 * | 1/2007 | Brask et al. | 438/704 |
| 2004/0132253 | A1 | 7/2004 | Hori | 438/275 |

FOREIGN PATENT DOCUMENTS

| EP | 0 982 764 A2 | 3/2000 |
|---|---|---|
| EP | 1 450 395 A2 | 8/2004 |

OTHER PUBLICATIONS

Translation of Official Communication from German Patent Office for German Patent Application No. 10 2007 063 270.5-33 dated Jul. 29, 2008.

\* cited by examiner

*Primary Examiner* — Evan Pert
*Assistant Examiner* — Andres Munoz
(74) *Attorney, Agent, or Firm* — Williams, Morgan & Amerson, P.C.

(57) ABSTRACT

By performing a heat treatment on the basis of a hydrogen ambient, exposed silicon-containing surface portions may be reorganized prior to the formation of gate dielectric materials. Hence, the interface quality and the material characteristics of the gate dielectrics may be improved, thereby reducing negative bias temperature instability effects in highly scaled P-channel transistors.

3 Claims, 4 Drawing Sheets

REDUCING THE CREATION OF CHARGE TRAPS AT GATE DIELECTRICS IN MOS TRANSISTORS BY PERFORMING A HYDROGEN TREATMENT

CROSS-REFERENCE TO RELATED APPLICATION

This is a divisional of application Ser. No. 12/125,490, filed May 22, 2008 now abandoned.

BACKGROUND OF THE INVENTION

1. Field of the Invention

Generally, the present disclosure relates to sophisticated integrated circuits, such as CPUs including scaled transistor elements, and, more particularly, to performance-reducing charge trap creation at the interface between the gate dielectric material and the channel region.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, for anneal cycles to activate dopants and to cure crystal damage without sacrificing the electrical characteristics of the interface.

For the reasons pointed out above, silicon dioxide is preferably used as a gate insulation layer in field effect transistors that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although generally high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range of 1-2 nm that may represent limitations for performance-driven circuits. That is, product reliability and lifetime are strongly correlated with short channel effects, i.e., impact ionization and hot carrier injection (HCI), in combination with gate dielectric leakage.

A further long-known effect may increasingly play an important role for CMOS devices, as threshold voltages and supply voltages are steadily reduced. It has been observed in the 60s that application of a negative voltage possibly in combination with thermal stress to the gate electrode of MOS transistors may result in a shift of the threshold voltage, i.e., a shift of the specific gate voltage at which a conductive channel forms adjacent to the gate insulation layer. This effect, also referred to as "negative bias temperature instability (NBTI)," is mainly present in PMOS transistors and was not considered particularly relevant for semiconductor devices in the following years due to the low influence on the overall device performance of devices, in particular as NMOS devices have increasingly been developed. This situation changed with the introduction of complex CMOS devices including high performance logic circuits, in which millions of signal nodes with PMOS and NMOS transistors are typically provided. As explained above, in these devices, the threshold voltage and the supply voltages have been reduced, while, on the other hand, the electric fields across the gate dielectrics is increased. Under such conditions, a change of the threshold voltage may have an even higher impact, since transistor operation variability may increase due to relatively higher influence of a shift of the threshold voltage. Moreover, the operating states resulting in the application of a negative voltage to the gate electrode of a PMOS transistor may depend on the signal path considered and the overall operational conditions, thereby making the threshold shift highly non-predictable and hence requiring appropriately set design criteria to ensure the desired performance of the transistors over the entire specified lifetime of the device. For example, a shift of the threshold voltage over the accumulated operating time may finally lead to violation of the timing specification of the device, which may not allow further use of the device despite the fact that no other major failure has occurred.

Generally, the NBTI effect is associated with the quality of the gate dielectric, for instance, comprising silicon, oxygen and nitrogen, and also the quality of the interface between the silicon in the channel region and the gate dielectric. That is, upon negative gate voltage, elevated temperature and other stress conditions, a charge trap may be created in the vicinity of the interface by an interface state, thereby causing holes to be trapped. Due to the positive interface states and the trapped charges, a shift in threshold voltage may be observed that may increase over time, depending on the overall stress conditions experienced by the transistors. In NMOS transistors, this effect is significantly less pronounced since the interface states and the fixed charges are of opposite polarity, thereby resulting in a lower net effect.

Since the NBTI effect gains in importance with reducing gate dielectric thickness and overall device dimensions, the present disclosure relates to methods and devices for avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which the stress-related shift of threshold voltage over time in advanced field effect transistors, in particular in P-channel transistors, may be reduced by conditioning an exposed silicon-containing surface of a semiconductor layer prior to the formation of gate dielectric materials, such as silicon dioxide based gate insulation layers or any other sophisticated gate dielectric materials, in order to enhance the characteristics of the crystalline material in the vicinity of the surface, thereby also enhancing the interface formed with the gate dielectric material. Furthermore, due to the enhanced surface and near-surface crystallinity of the semiconductor material, the quality of the gate dielectric material may be enhanced, which may also contribute to a reduced number of charge traps that may affect the threshold voltage, as previously explained. Without intending to restrict the present application to the following explanation, it is believed that, due to the superior quality of the crystalline semiconductor material in the vicinity of the interface between the gate dielectric material and the silicon-containing semiconductor material and the enhanced quality of the gate dielectric material itself, the creation of respective charge traps during the occurrence of any stress conditions, such as the static and dynamic application of negative bias, high temperature and the like, may be reduced, thereby also improving threshold voltage degradation over the lifetime of the device. Hence, increased flexibility may be obtained for designing the overall circuit layout, since less pronounced margins with respect to threshold degradation may have to be taken into consideration.

One illustrative method disclosed herein comprises performing at least one heat treatment in a hydrogen-containing ambient on a substrate having formed thereon an exposed silicon-containing semiconductor layer. The method further comprises forming a gate dielectric material on the silicon-containing semiconductor layer and forming a field effect transistor on the basis of the gate dielectric material.

A further illustrative method disclosed herein relates to the formation of a gate dielectric material. The method comprises performing a first heat treatment on an exposed silicon-containing semiconductor layer in the presence of hydrogen. Moreover, the method comprises forming a first gate insulation layer on the exposed silicon-containing semiconductor layer.

A still further illustrative method disclosed herein comprises determining, in a manufacturing flow for forming a gate dielectric material of a transistor, a state with an exposed silicon surface of a silicon layer of a semiconductor device. The method additionally comprises exposing a substrate comprising the silicon layer at least once to a hydrogen ambient, wherein the hydrogen ambient interacts with a surface of the silicon layer. Finally, the method comprises forming a gate insulating layer on the silicon layer after interacting with the hydrogen ambient.

BRIEF DESCRIPTION OF THE DRAWINGS

The disclosure may be understood by reference to the following description taken in conjunction with the accompanying drawings, in which like reference numerals identify like elements, and in which.

Figure 1A:
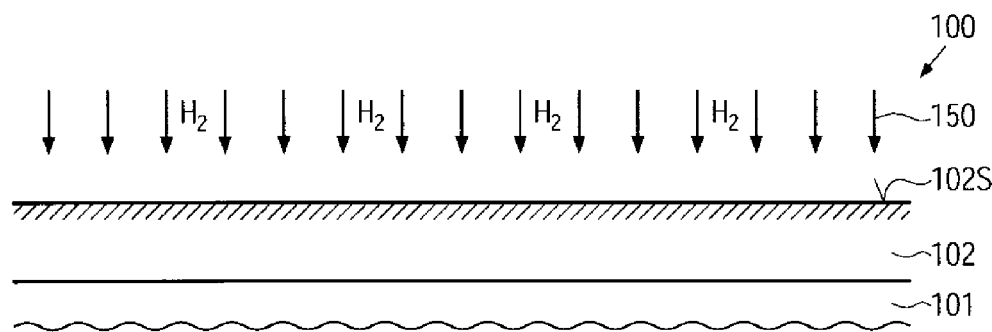
FIGS. 1a-1i schematically illustrate cross-sectional views of a semiconductor device during various manufacturing stages of a process flow for forming a gate dielectric material, wherein at least once an exposed silicon-containing surface of a semiconductor layer is exposed to a hydrogen ambient at elevated temperatures, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates manufacturing techniques and respective semiconductor devices in which a process flow for forming gate dielectric materials may comprise one or more heat treatments of an exposed silicon-containing semiconductor material in the presence of a hydrogen ambient in order to appropriately modify the surface characteristics and the crystallinity in the vicinity of the surface of the semiconductor material prior to the formation of a respective gate dielectric material. It is believed that the heat treatment in the presence of hydrogen may improve the characteristics, for instance, the surface roughness of the silicon-containing semiconductor material, by re-arranging the surface atoms, thereby providing enhanced conditions for the subsequent process steps, such as the formation of sacrificial layers and/or gate dielectrics, wherein finally the gate dielectric material may be formed, thereby also encountering enhanced process conditions, which may thus translate into a superiority of the gate dielectric material. In some illustrative aspects disclosed herein, any appropriate point of the overall manufacturing flow in forming gate dielectric materials may be identified and may be used to perform a respective heat treatment in the presence of hydrogen in order to improve process conditions and material characteristics during the further processing of the semiconductor device. Thus, in some illustrative embodiments, the respective surface treatment may be performed two or more times, when at least a portion of the silicon-containing semiconductor material may be exposed, for instance, when a gate dielectric material may be formed on the basis of two or more manufacturing stages so as to obtain a gate dielectric material of different thickness and/or composition in different device regions. The enhanced quality of the silicon-containing semiconductor material in the vicinity of the interface and also the enhanced quality of the gate dielectric material itself contribute to a reduced number of charge traps and increased resistivity for creating additional charge traps over the accumulated operational time of the semiconductor device, thereby efficiently reducing an increase of threshold voltage, in particular in P-channel transistors.

It should be appreciated that the principles disclosed herein may be applied to highly-scaled transistor elements, since, here, an undue increase in threshold voltage may have a more pronounced effect on the overall performance characteristics compared to less critical semiconductor devices. It should be appreciated, however, that the techniques disclosed herein may be applied to any type of semiconductor devices formed on the basis of a silicon-containing material without being restricted to any specific device dimensions. Furthermore, it is to be noted that in the following description of further illustrative embodiments, it is referred to a planar transistor configuration, since this type of transistor may currently represent the most dominant transistor architecture used in complex silicon-based integrated circuits. However, the treatment on the basis of a hydrogen ambient of an exposed silicon-containing semiconductor material may be performed prior to the formation of a gate dielectric material in any type of transistor configuration, thereby also providing reduced creation of charge traps, as explained above. For instance FinFet architectures, in which the gate dielectrics and thus the channel regions may be formed on two or more surface layer portions of a silicon-containing fin, or any other transistor architectures may also be included in the present disclosure.

FIG. 1a schematically illustrates a cross-sectional view of a semiconductor device 100 in an early manufacturing stage. That is, the semiconductor device 100 may comprise a substrate 101, which may represent any appropriate carrier material above which may be provided a silicon-containing semiconductor layer 102. The substrate 101 may be provided in the form of a substantially crystalline silicon material, a crystalline semiconductor material including an insulating layer, thereby providing a silicon-on-insulator (SOI) configuration, and the like. In other cases, the substrate 101 and the semiconductor layer 102 may represent an SOI configuration in specific device regions, while, in other device regions, a "bulk" configuration may be provided, that is, the semiconductor layer 102 may represent an upper portion of the substantially crystalline material of the substrate 101. It should be appreciated that the semiconductor layer 102, although comprising a significant portion of silicon, at least at a surface 102S thereof, may contain other components, or any such components may be incorporated in a later manufacturing stage, at least in some device regions. For example, embedded strain-inducing materials, such as silicon/germanium mixtures and the like, may be locally formed in the semiconductor layer 102 to adjust the overall conductivity and the transistor performance of the device 100. It should be appreciated that the term "semiconductor layer" may also include any "patterned" configurations of a semiconductor material as may be encountered during various manufacturing stages, wherein the "semiconductor layer" may have at least one layer portion with a surface area, which may be temporarily exposed prior to the formation of a gate dielectric material thereon. Thus, respective structural features, such as semiconductor "islands" defined by isolation structures, respective fins for FinFet patterned from a basic semiconductor material and the like, may also be included in the term semiconductor layer.

The device 100 as shown in FIG. 1a may be formed on the basis of the following processes. After providing the substrate 101, the semiconductor layer 102 may be formed thereon, for instance, by epitaxial growth techniques, wafer bond techniques, sophisticated implantation techniques using oxygen implantation species for locally or globally defining SOI configurations and the like. As previously explained, one or more appropriate techniques may be combined to obtain the semiconductor layer 102 with appropriate architecture in respective device regions of the device 100. For example, the semiconductor layer 102 may comprise different crystallographic orientations in different device regions and/or the semiconductor layer 102 may be locally formed on a buried insulating layer (not shown), depending on the overall device requirements. Moreover, in the manufacturing stage shown, the surface 102S of the semiconductor layer 102 may be exposed, at least locally, to a hydrogen ambient 150, which may be established on the basis of elevated temperatures, for instance, in the range of approximately 200-700° C. or even higher, or in other cases temperatures up to approximately 900° C. or more may be established. The ambient 150 may, in some illustrative embodiments, be established by supplying hydrogen to a controlled ambient, such as an environment created in a furnace or any other process tool that is appropriately configured to establish the desired hydrogen-containing ambient 150. For example, the ambient 150 may represent a substantially "pure" hydrogen ambient, when the supply of other components may be suppressed, while it should be appreciated that other components, such as minute amounts of nitrogen, oxygen and the like, may still be present in the ambient 150 due to any tool-related imperfections in establishing and maintaining the ambient 150. In other illustrative embodiments, additional components, such as an inert gas species, for instance, noble gas species in the form of argon, xenon and the like, may also be present in the ambient 150. The pressure in the ambient 150 may be selected to any appropriate value, for instance, in the range of approximately several Torr to several hundred Torr. Under these conditions, the semiconductor device 100 may be exposed to the ambient 150 for a time period of several minutes to several hours, depending on the overall device requirements. For example, in the manufacturing stage shown, the device 100 may be treated for approximately 2-60 minutes. During the interaction of the hydrogen with the silicon-containing surface 102 in the ambient 150, a re-organization of the surface atoms may occur, thereby improving the overall surface characteristics, such as surface roughness and the like, which may result in enhanced process results in subsequent manufacturing stages, thereby finally leading to an improved interface quality and material characteristics of a gate dielectric material still to be formed on at least some portions of the surface 102S.

Figure 1B:
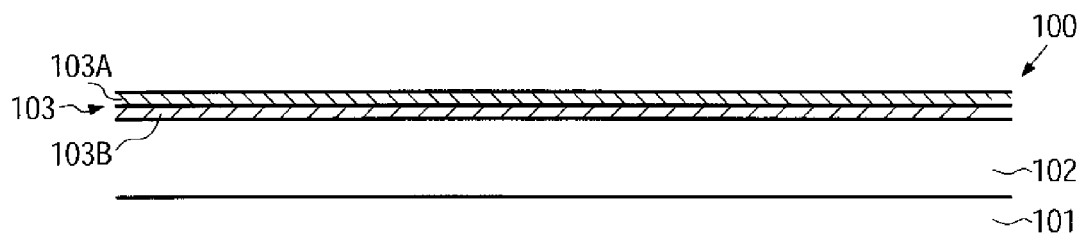

FIG. 1b schematically illustrates the semiconductor device 100 in a further advanced manufacturing stage. As shown, a stack 103 of dielectric layers may be formed on the surface 102S, wherein, in the embodiment shown, the dielectric layer stack 103 may comprise a layer 103B, for instance, in the form of a silicon dioxide material, followed by a layer 103A, which may be comprised of silicon nitride and the like. The dielectric layers 103A, 103B may be used as sacrificial material for the formation of isolation structures, for instance, in the form of trench isolations. It should be appreciated that, depending on the overall manufacturing flow, the dielectric layer stack 103 may be comprised of other materials and also the number of the layers contained therein may vary. The layer stack 103 may be formed on the basis of well-established techniques, such as forming the layer 103B by oxidation, deposition and the like, wherein the previous treatment in the ambient 150 may contribute to enhanced process conditions, which may result in a reduced number of surface and interface irregularities. Thereafter, the layer 103A may be formed on the basis of well-established plasma enhanced or thermally activated chemical vapor deposition techniques. Thereafter, the layer stack 103 may be patterned to receive respective openings conforming to dimensions of trenches to be formed in the silicon-containing semiconductor layer 102. The patterning of the layer stack 103 may be accomplished on the basis of well-established photolithography techniques. Next, an appropriate etch process may be performed to define respective trenches in the semiconductor layer 102, which extend to a desired depth. For instance, when an SOI configuration is considered, respective trenches may extend to and into a buried insulating layer, while, in some cases, trenches may extend through a corresponding buried insulating layer and into a crystalline material of the substrate 101, for instance, when forming trenches for capacitors, substrate diodes and the like. In other cases, the silicon-containing material layer 102 may intentionally be removed along with any buried insulating material so as to re-grow a silicon material having the characteristics of the underlying crystalline material of the substrate 101.

Figure 1C:
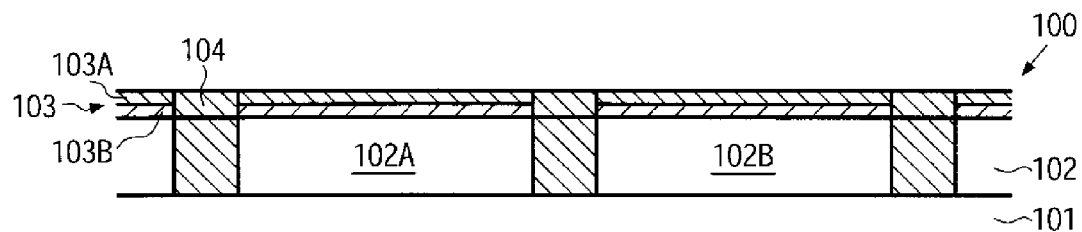

FIG. 1c schematically illustrates the semiconductor device 100 in an advanced manufacturing stage, in which respective trench isolation structures 104 are formed in the semiconductor layer 102, wherein the trench isolation structures 104 may be filled with any appropriate dielectric material to define respective regions 102A, 102B in the semiconductor layer 102, which, for convenience, may also be referred to as semiconductor layers. The trench isolation structures 104 may be formed on the basis of well-established techniques, for instance, by oxidation and deposition of an appropriate material, such as silicon dioxide. Thereafter, the sacrificial layer stack 103 may be removed, for instance, on the basis of chemical mechanical polishing (CMP) and selected etch techniques, for which appropriate recipes are well established.

Figure 1D:
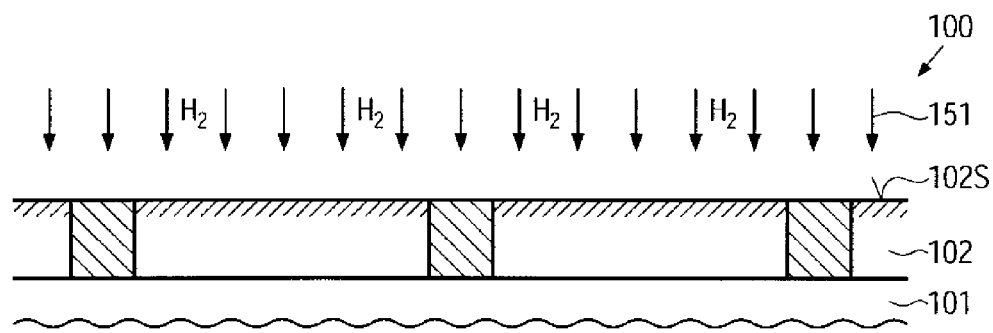

FIG. 1d schematically illustrates the semiconductor device 100 in a manufacturing stage in which the surface 102S is again exposed, for instance, after the removal of the dielectric layer stack 103. In the illustrative embodiment shown, a hydrogen-containing ambient 151 may be established on the basis of elevated temperatures to allow an interaction of the exposed surface 102S with the ambient 151. In some illustrative embodiments, the contact of the surface 102S with hydrogen at elevated temperatures may be initiated on the basis of the ambient 151, while not having performed the treatment 150 as shown in FIG. 1a. In other cases, the device 100 may be exposed to both the ambient 150 and the ambient 151. In still other cases, the device 100 may be processed without exposing the device 100 to the ambient 151. During the surface treatment based on the ambient 151, process parameters may be used as are also specified above, wherein it should be appreciated that one or more of the process parameters, such as temperature, hydrogen contents, when a plurality of other inert gas components are present, pressure and the like, may be different compared to the ambient 150.

Figure 1E:
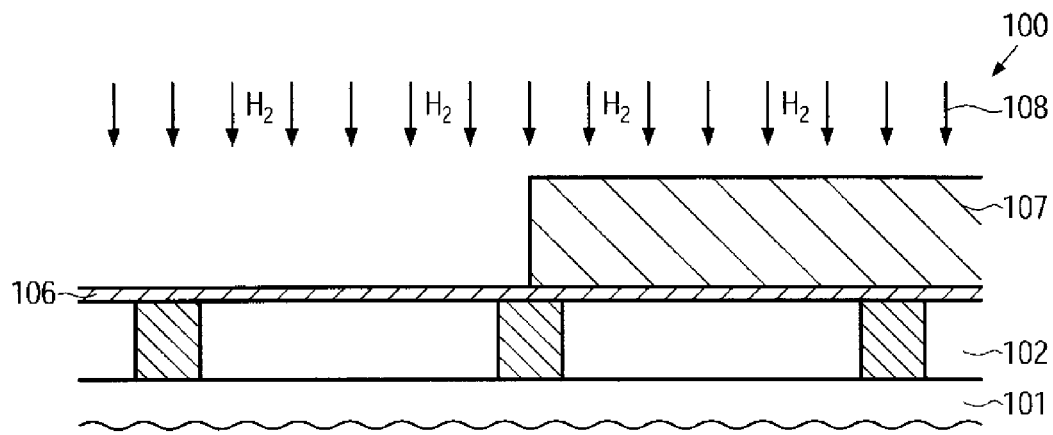

FIG. 1e schematically illustrates the semiconductor device 100 in a further advanced manufacturing stage, wherein, in some illustrative embodiments, the device 100 may have experienced a treatment on the basis of the ambient 150 and/or on the basis of the ambient 151, while, in other cases, the device 100 may not have been treated using any of the ambients 150, 151. As shown, the device 100 may comprise a sacrificial material layer 106, for instance, in the form of silicon dioxide or any other appropriate material, which may be used during an implantation sequence 108 to enhance the efficiency and, thus, process conditions during the implantation sequence 108. The implantation sequence 108 may comprise a plurality of masking steps for forming respective implantation masks 107, wherein, for convenience, only one resist mask 107 is shown. During the implantation sequence 108, appropriate dopant species may be incorporated to adjust the overall transistor characteristics, for instance, forming respective well regions and adjusting other basic characteristics, such as threshold voltage, punch-through voltage and the like. Since these characteristics may be different for the various transistor types in the device 100, the corresponding resist mask 107 may block the corresponding device regions from unwanted implantation species.

Figure 1F:
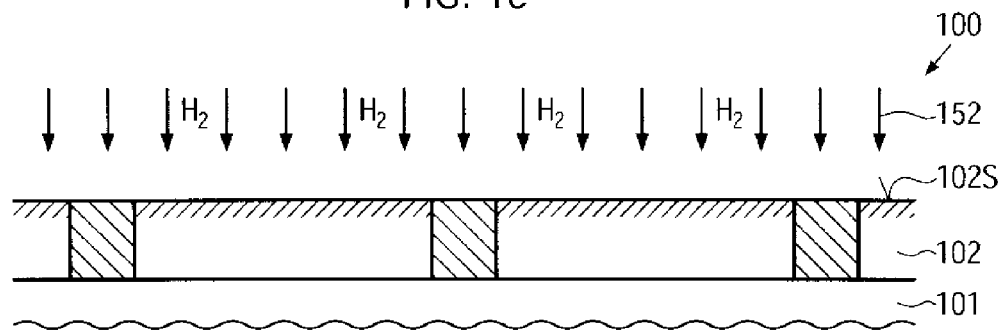

FIG. 1f schematically illustrates the device 100 in a further advanced manufacturing stage, wherein the surface 102S may be exposed, for instance, after removing any resist masks 107 and the sacrificial material layer 106. Also, in this manufacturing stage, the device 100 may have experienced one or both of the treatments 150, 151, while, in other illustrative embodiments, the exposed surface 102S of FIG. 1f may be exposed to a hydrogen ambient for the first time, which may be accomplished on the basis of a heat treatment 152 in the presence of hydrogen. Thus, as previously explained, the surface 102S may come into contact with the hydrogen species of the ambient 152, thereby providing enhanced surface characteristics. The ambient 152 may be established on the basis of elevated temperatures, wherein, in some illustrative embodiments, the temperature range may be selected from approximately 200-650° C. to avoid undue dopant diffusion in the semiconductor layer 102. With respect to other process parameters, such as hydrogen contents, pressure, duration and the like, the same criteria apply as previously explained with reference to the treatments 150, 151.

Figure 1G:
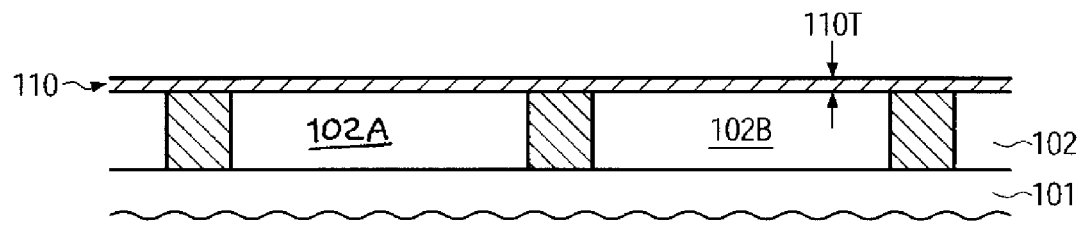

FIG. 1g schematically illustrates the semiconductor device 100 with a gate dielectric material 110 formed on the surface 102S. The gate dielectric material 110 may be comprised of any appropriate material, for instance, a silicon dioxide material including a specified amount of nitrogen may be used, or silicon dioxide material may be used, while, in other cases, silicon nitride material, possibly in combination with oxygen, may be provided. It should be further appreciated that the dielectric material 110 may also comprise high-k dielectric materials, which may be understood as dielectric materials having a dielectric constant of approximately 10 or higher. For instance, hafnium oxide, zirconium oxide and the like may be used as appropriate high-k dielectric materials. In some cases, these materials may be provided in combination with "conventional" gate dielectrics, such as silicon dioxide, however, with a substantially reduced thickness of several Angstrom. In the embodiment shown, the gate dielectric material 110 may be formed on the basis of well-established oxidation and/or deposition techniques, for instance, by using nitrogen-containing silicon dioxide material with a thickness 110 T that may be less than a desired thickness of the region 102B, since the final thickness may be obtained in a later stage, when also a desired thin gate dielectric material is to formed above the region. Thereafter, the dielectric material 110 may be selectively removed, for instance, from above the region 102A, which may be accomplished on the basis of well established lithography and etch techniques.

Figure 1H:
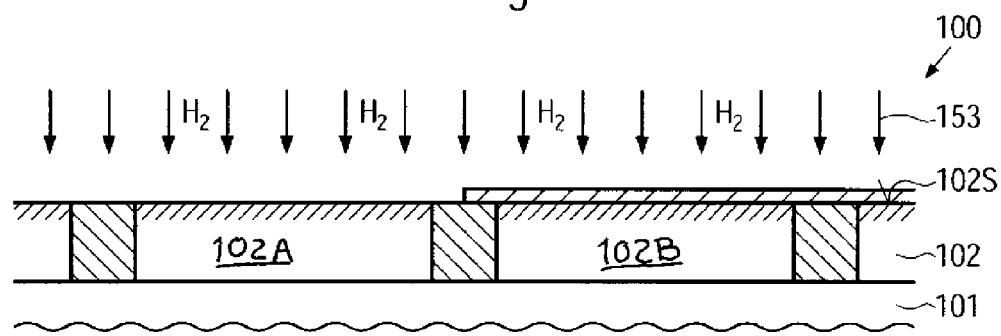

FIG. 1h schematically illustrates the device 100 in a further advanced manufacturing stage, in which the surface 102S above the region 102A is exposed, while the surface 102S above the region 102B is still covered by the dielectric gate material 110. Moreover, in the embodiment shown, the device 100 may be exposed to a heat treatment 153 in the presence of hydrogen so that the exposed portion of the surface 102S may interact with the ambient 153. In some illustrative embodiments, the device 100 may have experienced none, one, two or three of the previous treatments 150, 151, 152, depending on the overall process strategy. Thus, during the treatment 153, at least the surface 102S above the region 102A may be improved with respect to material characteristics prior to the formation of a respective thin dielectric material for a high performance transistor, which may typically exhibit a low threshold voltage in combination with a low operating voltage, as previously described. In this case, the gate dielectric material formed above the region 102B may be less critical, since here typical transistor elements may be formed that may be operated on the basis of a higher threshold voltage, thereby exhibiting a less pronounced dependency on a gradual shift of threshold voltage. In other cases, the material characteristics may be enhanced in both regions 102A, 102B on the basis of one or more of the treatments 150, 151, 152.

Figure 1I:
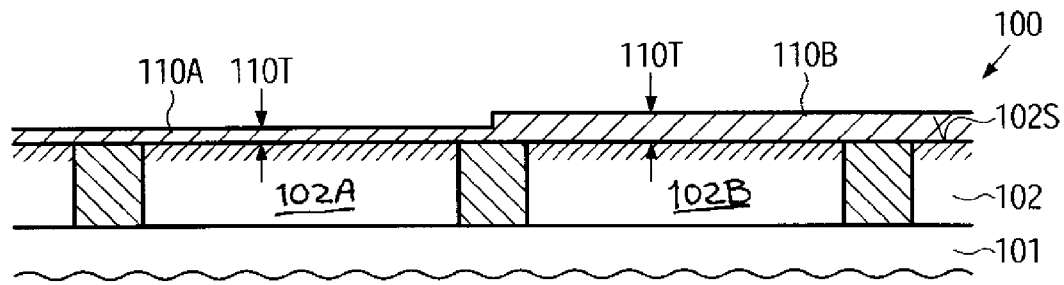

FIG. 1i schematically illustrates the semiconductor device 100 after forming a further gate dielectric material 110A in the region 102A, while increasing the thickness 110 T in the region 102B, thereby providing a final second gate dielectric material 110B in the region 102B. The gate dielectric materials 110A, 110B may be formed on the basis of well-established techniques, for instance, including oxidation and/or deposition, as previously explained with reference to the dielectric material 110. Thus, depending on the overall process strategy, the crystalline quality of the semiconductor layer 102 in the vicinity of the interface between the layer 102 and a gate dielectric material, i.e., the materials 110A and/or 110B, which may, for convenience, also be referred to as interface 102S, and the quality of the gate dielectric materials 110A and/or 110B themselves, may be enhanced due to performing at least one of the treatments 150, 151, 152, 153. Thus, in the manufacturing stage shown, the amount of charge traps and respective interface states for creating respective fixed charges may be reduced and also the resistivity with respect to creating such charge traps during the further processing and during operating of the semiconductor device 100, i.e., during applying increased negative bias voltages to the gate electrodes still to be formed on the basis of the dielectric materials, may be increased.

It should be appreciated that, in the above-described process flow for forming the gate dielectric materials 110A, 110B, the treatments 150, 151, 152, 153 may be performed at any appropriate stage when the surface 102S is exposed, at least partially, wherein, in some illustrative embodiments, only one of the treatments 150, 151, 512, 153 may be performed, while, in other illustrative embodiments, two or more of the treatments 150, 151, 152, 153 may be applied, thereby even further enhancing the overall characteristics of the interface 102S and the gate dielectric materials 110A, 110B.

Figure 1J:
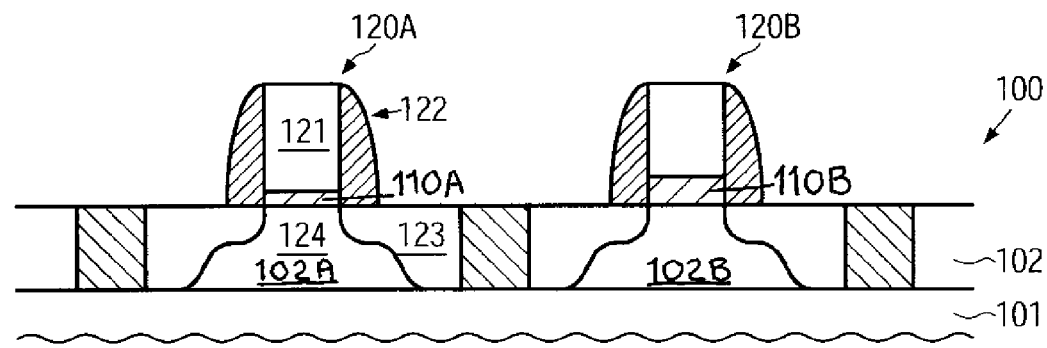
FIG. 1j schematically illustrates a cross-sectional view of the semiconductor device including the gate dielectric material previously formed and respective transistor structures, according to illustrative embodiments.

FIG. 1j schematically illustrates the semiconductor device 100 in a further advanced manufacturing stage, in which a first transistor 120A is formed in and above the region 102A on the basis of the gate dielectric material 110A, which now represents a gate insulation layer 110A. Similarly, a second transistor 120B is formed in and above the region 102B using the gate dielectric material 110B having the increased thickness as may be appropriate for the transistor 120B. For instance, the transistors 120A, 120B may represent P-channel transistors, wherein the transistor 120A may represent a high performance transistor, as may, for instance, be used in speed critical logic signal paths and the like. It should be appreciated that the respective improved interface characteristics and an improved quality of the gate insulation layers may also be obtained in N-channel transistors, thereby also enhancing the overall device characteristics of these transistor elements. As shown, the transistors 120A, 120B may comprise a gate electrode structure 121, possibly in combination with an appropriate spacer structure 122. Furthermore, drain and source regions 123 may be formed in accordance with the overall device requirements. Furthermore, respective metal silicide regions, if required, may be formed in the drain and source regions 123 and in the gate electrode 121. Thus, the transistors 120A and/or 120B may comprise in a respective channel region 124, i.e., the region in the vicinity of the gate insulation layers 110A, 110B, a reduced number of charge traps, wherein the number thereof may increase in a less pronounced manner during negative bias stress conditions compared to conventional devices, thereby reducing the increase of threshold voltage in the P-channel transistors 120A and/or 120B, as previously explained.

Figure 1K:
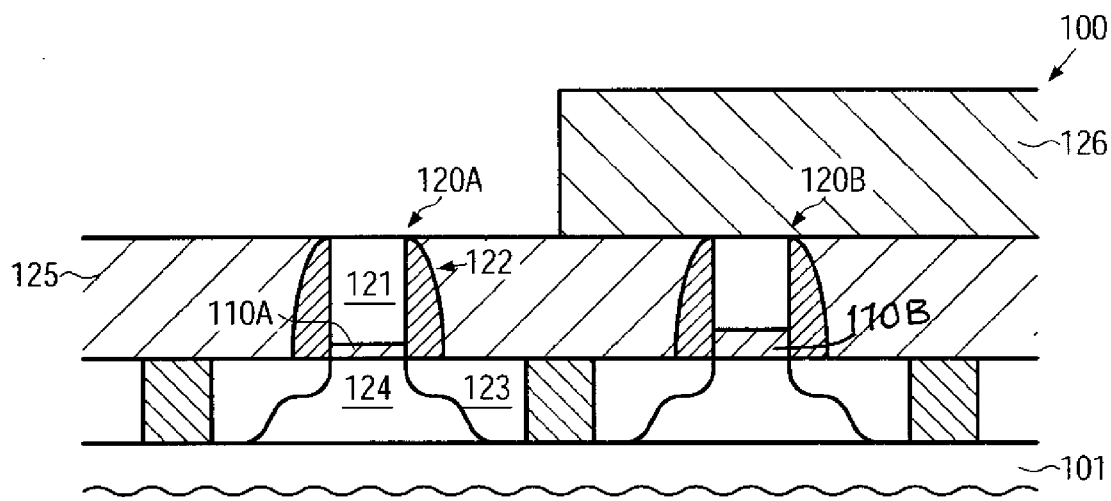
FIGS. 1k-1m schematically illustrate cross-sectional views of a semiconductor device during various manufacturing stages in which a replacement gate structure may be formed at a later manufacturing state with an additional heat treatment in the presence of hydrogen prior to forming the final gate dielectric material, according to still further illustrative embodiments.
Figure 1L:
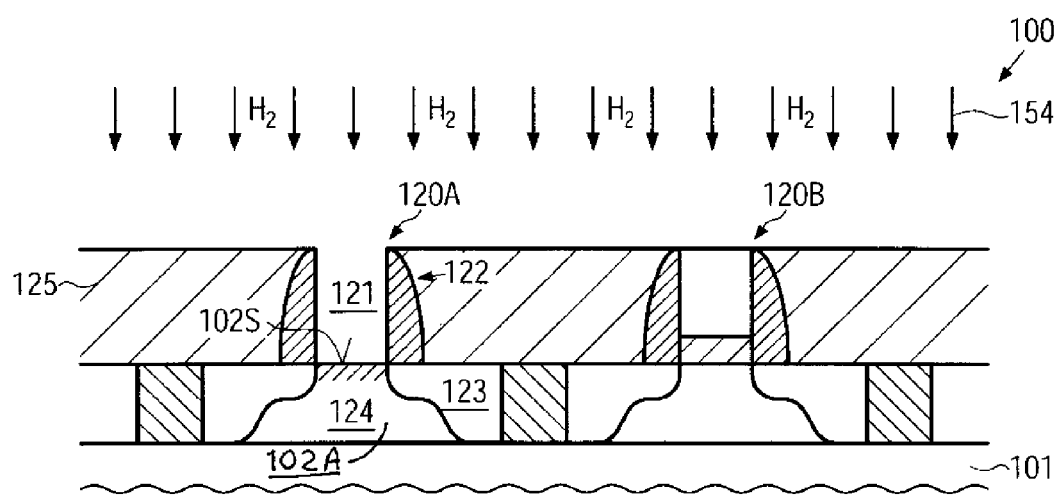
Figure 1M:
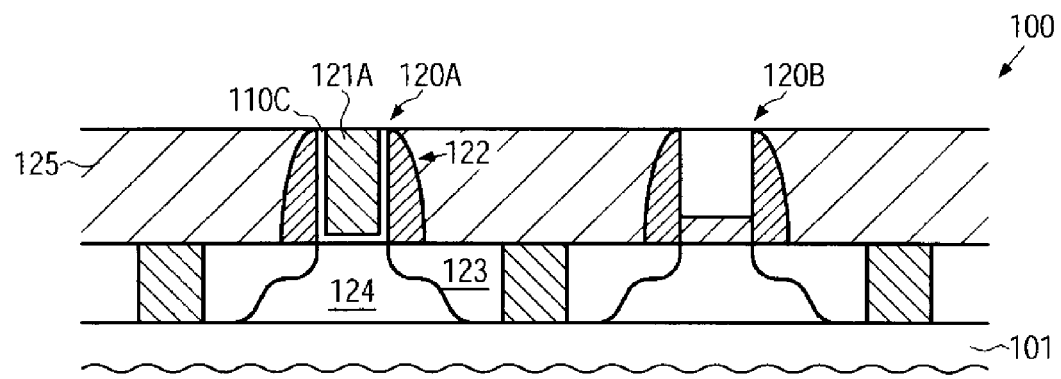

With reference to FIGS. 1k-1m, further illustrative embodiments will now be described in more detail, in which the gate dielectric material for at least one type of transistor may be formed in a later manufacturing stage by forming a replacement gate structure.

FIG. 1k schematically illustrates the semiconductor device 100 in an advanced manufacturing stage, in which transistor structures 120A, 120B may be completed, for instance, as shown in FIG. 1j, while, in other cases, only the gate electrode structure 121 may be completed while other device regions, such as the drain and source regions 123, may still have to be formed. Moreover, a dielectric material 125 may be formed so as to enclose the transistors 120A, 120B, while exposing a top portion of the respective gate electrode structures 121. Furthermore, an etch mask 126 may be formed to cover the transistor 120B, which may represent a device region, in which the gate electrode structure and the corresponding gate insulation layer 110B may have to be maintained, at least partially. The dielectric material 125 may be formed on the basis of well-established techniques, for instance, by depositing an appropriate material, such as silicon nitride and the like, and performing a planarization process, for instance, on the basis of chemical mechanical polishing (CMP). Thereafter, an etch mask 126 may be formed, for instance, in the form of a resist mask using well-established lithography techniques. Thereafter, an etch process may be performed to selectively remove the material of the gate electrode structure 121 and the gate insulation layer 110A. For this purpose, selective etch recipes may be used, as are well established for patterning polysilicon material in the presence of silicon dioxide and the like. After removing the material of the gate electrode structure 121, the gate insulation layer 110A may be removed on the basis of selective etch recipes, as are available in the art.

FIG. 1l schematically illustrates the device 100 after completing the above-described process sequence and after removing the etch mask 126. Thus, a portion of the surface 102S corresponding to the gate electrode structure 121 may be exposed to a hydrogen-containing ambient 154, thereby improving the overall surface characteristics, as previously explained. The ambient 154 may be established on the basis of appropriately selected parameters, wherein the temperature may be selected to be compatible with the manufacturing stage shown in FIG. 11. That is, if the drain and source regions 123 are already formed in the region 102A, the temperature may be selected such that undue dopant diffusion may be substantially avoided. Moreover, in case any metal silicide material may be formed in the drain and source regions 123, the temperature range may be selected to be approximately 200-400° C., thereby substantially avoiding any negative influence on other transistor components. When the drain and source regions 123 are not yet formed in this manufacturing stage, higher temperatures may be applied, as previously discussed. With respect to other process parameters, such as hydrogen content, pressure, duration and the like, the same criteria apply as previously explained. After the treatment 154, the further processing may be continued, for instance, by depositing an appropriate gate dielectric material 110C (FIG. 1m), which may comprise high-k dielectric material, possibly in combination with a basic silicon dioxide material or other conventional dielectric materials. Moreover, an appropriate gate electrode material 121A (FIG. 1m) may be formed, for instance, comprising an appropriate metal-containing material to enhance the overall conductivity of the gate electrode structure. Thereafter, any excess material may be removed, for instance, by CMP and the like. Thus, also in the case of providing a replacement gate electrode structure including the material 121A and the newly formed gate dielectric material 110C, an improvement of the overall interface characteristics may be accomplished on the basis of the treatment 154.

As a result, the principles disclosed herein provide enhanced techniques and semiconductor devices in which a gradual increase of threshold voltage over time may be reduced by improving the interface quality and the material characteristics of gate dielectric materials on the basis of a heat treatment in the presence of hydrogen in order to reorganize surface atoms of exposed silicon surface portions prior to the formation of respective gate dielectrics. A respective heat treatment on the basis of hydrogen may be performed at any appropriate manufacturing stage including an exposed surface portion of a silicon-containing semiconductor material prior to actually forming a gate dielectric material. In some illustrative embodiments, respective manufacturing stages with exposed surface portions may be determined and at one respective manufacturing stage a corresponding treatment may be performed, while, in other cases, two or more treatments may be carried out so as to further enhance the overall process efficiency. Thus, a high degree of compatibility with existing manufacturing techniques or future technologies may be obtained, wherein, in some cases, only one single additional process step has to be added. Consequently, the performance degradation over the useful lifetime of the devices may be reduced so that, in particular for P-channel transistors, a less pronounced performance variability with respect to negative bias voltages may be achieved, which may provide increased design flexibility, since less stringent constraints with respect to NBTI effects may have to be taken into consideration. Furthermore, the principles disclosed herein are independent of any specific device configuration for transistor elements and may be applied to other transistor configurations, such as FinFet architectures, replacement gate techniques and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a gate electrode using a gate replacement technique, the method comprising:
performing a first heat treatment on a silicon-containing semiconductor layer having a dielectric layer formed on its surface in the presence of hydrogen;
forming a first dielectric layer above said silicon-containing semiconductor layer after said first heat treatment;
forming a gate electrode structure above said first dielectric layer and silicon-containing semiconductor layer, the gate electrode being surrounded by a dielectric material;
removing said gate electrode structure and said first dielectric layer beneath said gate electrode structure to expose a surface of said silicon-containing semiconductor layer beneath said gate electrode structure;
performing a second heat treatment on said exposed surface of said silicon-containing semiconductor layer in the presence of hydrogen;
forming a second gate insulation layer on said exposed surface of said silicon-containing semiconductor layer after performing said second heat treatment; and
forming a replacement gate electrode structure above said second gate insulation layer to form said gate electrode, said second gate insulation layer having a thickness differing from a thickness of a first gate insulation layer comprising the dielectric layer and the first dielectric layer.

2. The method of claim 1, further comprising creating a dopant profile in said silicon-containing semiconductor layer and performing a further heat treatment in the presence of hydrogen after creating said dopant profile.

3. The method of claim 1, further comprising forming a trench isolation structure in said silicon-containing semiconductor layer prior to forming said first gate insulation layer, wherein a further heat treatment in the presence of hydrogen is performed prior to forming said trench isolation structure.

* * * * *